United States Patent [19]
Jain

[11] Patent Number: 5,862,361
[45] Date of Patent: Jan. 19, 1999

[54] SLICED SYNCHRONOUS SIMULATION ENGINE FOR HIGH SPEED SIMULATION OF INTEGRATED CIRCUIT BEHAVIOR

[75] Inventor: Prem P. Jain, Austin, Tex.

[73] Assignee: C.A.E. Plus, Inc., Austin, Tex.

[21] Appl. No.: 524,479

[22] Filed: Sep. 7, 1995

[51] Int. Cl.$^6$ .................................................... G06F 9/455
[52] U.S. Cl. ............................................................ 395/500
[58] Field of Search ................................... 364/488, 489, 364/490, 491, 578; 395/500

[56] References Cited

U.S. PATENT DOCUMENTS

| | | | |
|---|---|---|---|
| 4,656,603 | 4/1987 | Dunn . | |
| 4,813,013 | 3/1989 | Dunn . | |
| 4,967,386 | 10/1990 | Maeda et al. | 364/578 |
| 5,034,899 | 7/1991 | Schult . | |
| 5,067,091 | 11/1991 | Nakazawa . | |
| 5,111,413 | 5/1992 | Lazansky et al. | 364/578 |
| 5,146,583 | 9/1992 | Matsumaka et al. . | |
| 5,155,836 | 10/1992 | Jordan et al. . | |
| 5,164,911 | 11/1992 | Juran et al. . | |
| 5,220,512 | 6/1993 | Watkins et al. . | |
| 5,222,030 | 6/1993 | Dangelo et al. . | |
| 5,258,919 | 11/1993 | Yamanouchi et al. . | |
| 5,274,793 | 12/1993 | Kuroda et al. . | |
| 5,276,855 | 1/1994 | Kitahara . | |
| 5,331,569 | 7/1994 | Iijima . | |
| 5,333,032 | 7/1994 | Matsumoto et al. . | |
| 5,345,393 | 9/1994 | Ueda . | |
| 5,371,683 | 12/1994 | Fukazawa et al. . | |
| 5,544,067 | 8/1996 | Rostoker et al. | 364/489 |

OTHER PUBLICATIONS

Event Scheduling in Window Based Parallel Simulation Schemes, Ayani and Rajaei, Mar. 1992.
Impact of Event Scheduling on Performance of Time Warp Parallel Simulations, Ahmed, Ronngren and Ayani, May 1994.

*Primary Examiner*—Kevin J. Teska
*Assistant Examiner*—Dan Fiul
*Attorney, Agent, or Firm*—Conley, Rose & Tayon; Lawrence J. Merkel; Kevin L. Daffer

[57] ABSTRACT

A custom simulation engine is provided which operates upon a set of statically scheduled events. The simulation engine is automatically created from a functional description of the integrated circuit design. Each element of each partition within the functional description is analyzed and events related to the element are scheduled. The statically scheduled events are used to produce scheduled source code, which is then compiled to produce the simulation engine. VHDL or Verilog descriptions are similarly automatically created from the functional description. Subsequently, the VHDL or Verilog descriptions are synthesized into a netlist describing a final design of an integrated circuit. The entire process is automatic, and so the simulation engine and the netlist are functionally equivalent by construction. No simulation of the VHDL or Verilog descriptions is required as the present simulation engine correctly represents the design. Manual development of a custom simulation engine is eliminated. Additionally, the current simulation engine may enable software intended to be run upon the modeled integrated circuit to be executed prior to receiving hardware. Software and hardware may be concurrently designed and verified.

25 Claims, 9 Drawing Sheets

Microfiche Appendix Included
(1 Microfiche, 2 Pages)

| CLK | Time | Events |
|---|---|---|
| 0 | $t_1$ | A, B |
| 0 | $t_2$ | D |
| 0 | $t_3$ | E |
| 0 | $t_4$ | — |
| 0 | $t_5$ | I |
| 1 | $t_1$ | C |
| 1 | $t_2$ | — |
| 1 | $t_3$ | F |
| 1 | $t_4$ | G, H |
| 1 | $t_5$ | I |
| 2 | $t_1$ | A, B, C |
| 2 | $t_2$ | D |
| 2 | $t_3$ | E, F |
| 2 | $t_4$ | H |
| 2 | $t_5$ | I |

| CLK | Time | Events |
|---|---|---|
| 0 | $t_1$ | A, B |
| 0 | $t_2$ | D |
| 0 | $t_3$ | E |
| 0 | $t_4$ | — |
| 0 | $t_5$ | I |
| 1 | $t_1$ | C |
| 1 | $t_2$ | — |
| 1 | $t_3$ | F |
| 1 | $t_4$ | G, H |
| 1 | $t_5$ | I |
| 2 | $t_1$ | A, B, C |
| 2 | $t_2$ | D |
| 2 | $t_3$ | E, F |
| 2 | $t_4$ | H |
| 2 | $t_5$ | I |

| CLK | Time | Events |
|---|---|---|
| 0 | $t_1$ | A, B, C |
| 0 | $t_2$ | D |
| 0 | $t_3$ | E, F |
| 0 | $t_4$ | G, H |
| 0 | $t_5$ | I |
| 1 | $t_1$ | A, B, C |
| 1 | $t_2$ | D |
| 1 | $t_3$ | E, F |
| 1 | $t_4$ | G, H |
| 1 | $t_5$ | I |
| 2 | $t_1$ | A, B, C |
| 2 | $t_2$ | D |
| 2 | $t_3$ | E, F |
| 2 | $t_4$ | G, H |
| 2 | $t_5$ | I |

| Partition / Time Slice | 0 | 1 | 2 | . . . . | N-2 | N-1 | N |
|---|---|---|---|---|---|---|---|
| 0 | 0 | 0 | 1 | | 1 | 1 | 0 |
| 1 | 1 | 0 | 1 | | 0 | 0 | 0 |
| 2 | 0 | 0 | 1 | | 1 | 0 | 0 |
| ⋮ | | | | | | | |
| M-2 | 0 | 1 | 0 | | 0 | 1 | 1 |
| M-1 | 0 | 0 | 1 | | 0 | 0 | 0 |
| M | 1 | 1 | 0 | | 0 | 0 | 0 |

FIG 6

SLICED SYNCHRONOUS SIMULATION ENGINE FOR HIGH SPEED SIMULATION OF INTEGRATED CIRCUIT BEHAVIOR

BACKGROUND OF THE INVENTION

Incorporated herein is a computer program listing microfiche appendix of source code which creates a sliced synchronous simulation engine from a functional description. Also included in the microfiche appendix consisting of 1 microfiche and 2 pages is an exemplary graphical behavioral description including two partitions and the scheduled source code created according to the program listing. Copyright, 1995, C.A.E. Plus, Inc. A portion of the disclosure to this patent document contains material which is subject to copyright protection. The copyright owner expressly reserves all copyright rights whatsoever to materials contained in this disclosure, including materials within the "microfiche appendix" which are incorporated herein by reference.

1. Field of the Invention

This invention relates to the field of integrated circuit simulation and validation and, more particularly, to the validation of complex integrated circuits via a high speed simulation engine.

2. Description of the Relevant Art

Integrated circuits are employed in a wide variety of applications, from computer systems to automobiles. An integrated circuit is a electronic device in which a plurality of transistors are configured upon a single, monolithic substrate. The plurality of transistors are configured to perform a desired operation or operations.

Integrated circuits are often synchronous circuits. A synchronous circuit is a circuit embodying memory elements and combinatorial logic coupled between the memory elements. The memory elements store a plurality of values referred to as the current "state" of the integrated circuit. Given a particular state, the integrated circuit calculates a next state according to the combinatorial logic. The next state is presented to the inputs of the memory elements, which store the next state as the new current state according to a particular clock. As used herein, a clock is a signal having a repetitive waveform. The time interval in which a single instance of the repetitive waveform occurs is referred to as the "period" of the waveform.

The period of the waveform determines the time interval allotted for the combinatorial logic of the integrated circuit to perform its transformation of current state to next state. At a particular point within the period, the memory elements discard the values being stored and store the values presented at their inputs (referred to as capturing a value). In one embodiment, the clock is a square wave having a rising edge (a transition from a low value to a high value) and a falling edge (a transition from a high value to a low value). Memory elements may be configured to capture values at the rising edge of the clock or, conversely, at the falling edge of the clock. In one embodiment, memory elements comprise registers configured to store a value and arrays of memory locations configured to store a plurality of values.

When integrated circuits were first developed, the semiconductor fabrication technologies employed to manufacture the integrated circuits afforded only relatively simple integrated circuits. These integrated circuits could be designed on paper and could be verified, or validated, as functionally correct via a small number of test vectors manually created by the designer of the integrated circuit. As used herein, a "test vector" is a set of stimulus values for an integrated circuit accompanied by a set of responses expected from the integrated circuit. For example, a stimulus may be a set of values to be applied to input pins of the integrated circuit and the expected responses may be a set of values expected to appear upon output pins of the integrated circuit.

As semiconductor fabrication technologies improve, more transistors may be placed on a given semiconductor substrate. In recent years, integrated circuits have become more complex. Due to the increased complexity, the design and subsequent validation techniques have changed. With the advent of these more complex integrated circuits, a set of event-driven simulators were developed to aid the design and validation of integrated circuits. A simulator automatically applies a set of test vectors to a simulation model representing an integrated circuit. The simulation results are then checked against the expected results within the test vector. The test vectors may be created manually, or may be generated in an automated fashion. The simulator may also be referred to as a simulation engine.

One popular representation of the simulation model is a register-transfer level (RTL) description. An RTL description represents an integrated circuit as a set of elements such as memory elements and combinatorial circuits, as well as the interconnection between the elements. Each element within the description comprises a record defining the element, its functionality, and the time interval required for the element to operate. The time interval is typically measured from an edge of the clock which is used by the memory elements to capture state.

The RTL description is a "functional description". As used herein, a functional description of an integrated circuit is a description which may be synthesized into a description of transistors to be configured onto a semiconductor substrate to form the integrated circuit. It is noted that functional descriptions may include multiple partitions. The multiple partitions comprise a high level division of integrated circuit functionality into blocks of functionality. Each partition describes a particular block of functionality. Partitions may include dissimilar clocks having dissimilar periods with respect to the clock s of other partitions. However, the dissimilar periods are integer multiples of a common base period. Additionally the clocks of different partitions may have different phases. Clocks having a similar period have different phases if their rising and falling edges occur at dissimilar times with respect to each other. Because clocks may have different periods and different phases, asynchronous communication may occur between the synchronous partitions of an integrated circuit.

Event-driven simulators process a plurality of events generated by the simulation model, dynamically scheduling new events based upon the processing of the current events. An "event" is a function to be performed at a particular time. Exemplary events within integrated circuits include the output of an adder circuit becoming valid or the capturing of a value by a memory element. The collection of events created by an integrated circuit design, when taken together, comprise the desired operation of the integrated circuit.

When an event is "scheduled", values associated with the event are stored in a data structure and the event is logged for later action at a particular time by the event-driven simulator. When the events scheduled for the current time are completed, the event-driven simulator increments its time base to the next time at which events are scheduled. The events at that time are processed, possibly creating more new events. Upon completion of event processing at the new time, the event-driven simulator increments to yet another time. The time increments are dynamically determined by the events scheduled, and may vary from increment to increment.

Event-driven simulation is useful for exploring possible integrated circuit designs for a suitable design. The design may be under constant change, and so the events generated may be unpredictable from simulation to simulation. Unfortunately, event-driven simulation is not suitable for the rigorous validation required for complex integrated circuits. Often, design validation time is the dominant factor in the amount of time required to complete a design. Numerous test vectors must be created and simulated, and so the simulator must be able to execute a large number of test vectors in a relatively short period of time. Event-driven simulators execute relatively slowly, due to the overhead of dynamic scheduling of events. When an event is scheduled, information pertinent to the event is saved in a data structure. Exemplary information includes the function to be performed when the event is processed as well as any input values utilized by the function. These data structures are stored in memory until the event is processed. The storing of events and retrieving of events for execution accounts for a large portion of the processing time associated with event-driven simulators. A faster method for simulating complex integrated circuits is desired.

SUMMARY OF THE INVENTION

The problems outlined above are in large part solved by a simulation engine according to the present invention. The present simulation engine is a custom simulator which operates upon a set of statically scheduled events. This custom simulation engine is automatically created from a functional description of the integrated circuit design. The functional description (such as an RTL description) is statically scheduleable because it is synchronous and therefore repetitive in time. Each element of each partition within the functional description is analyzed and events related to the element are scheduled. The statically scheduled events are used to produce scheduled source code, which is then compiled to produce the simulation engine. By statically scheduling the events and storing event-related information in a global variable space (as opposed to local to each event), much of the time wasted in switching from one event context to another is eliminated. Simulation may be performed in significantly less time than was previously achievable using event-driven simulators. Additionally, because the simulator is custom-created, no separate simulator program is needed.

The present simulation engine is automatically created from a functional description. VHDL or Verilog descriptions are similarly automatically created from the functional description. Subsequently, the VHDL or Verilog descriptions are synthesized into a netlist describing the final design. The entire process is automatic, and so no consistency problems develop as can occur when a portion of the process is performed manually. The statically scheduled 'C' simulation engine and the Verilog or VHDL netlist are functionally equivalent by construction. No simulation of the VHDL or Verilog descriptions is required as the present simulation engine correctly represents the design and is a significantly faster vehicle for performing functional validation. Manual development of a custom simulation engine, often performed previously to create a fast simulator, is eliminated. Additionally, the speed of the current simulation engine may enable software intended to be run upon the modeled integrated circuit to be executed prior to receiving hardware. Advantageously, software and hardware may be concurrently designed and verified.

Broadly speaking, the present invention contemplates a method for creating a simulation engine from a functional description. The method includes statically scheduling events associated with the functional description. Subsequently, scheduled source code is formed according to the scheduling. The scheduled source code is then compiled into the simulation engine.

The present invention still further contemplates a method for creating a synchronous simulation model from an RTL model. The method includes analyzing each one of a plurality of partitions within the RTL model to determine each time at which an event occurs. Times are measured with respect to a clock associated with the partition being analyzed. A clock is selected as the master clock for the simulation model. In one embodiment, the clock is the least common multiple of the clocks associated with the partitions. Each event determined by the analysis step is recalibrated with respect to the master clock, forming a plurality of time slices. Source code for the simulation model is then created from the plurality of time slices, and the source code is compiled.

BRIEF DESCRIPTION OF THE DRAWINGS

Other objects and advantages of the invention will become apparent upon reading the following detailed description and upon reference to the accompanying drawings in which:

FIG. 6 is a diagram of a global scheduling table created in one of the steps shown in FIG. 4.;

Figure 1:
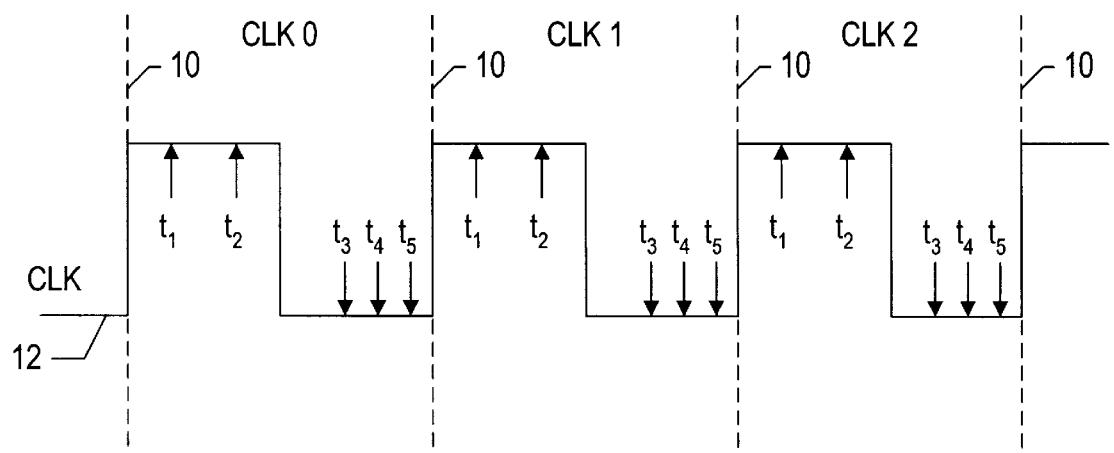
FIG. 1 is a timing diagram showing events generated according to an event-driven simulator.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a timing diagram of three consecutive clock cycles of an exemplary integrated circuit design is shown. The clock cycles are indicated by vertical dashed lines 10 in the diagram, and are labeled CLK0, CLK1, and CLK2. The exemplary integrated circuit captures state upon the rising edge of a clock signal CLK (shown as reference number 12), and therefore vertical dashed lines 10 are drawn to the rising edges of clock signal 12. Times at which events may occur for the exemplary integrated circuit are marked within each clock cycle by arrows labeled $t_1$, $t_2$, $t_3$, $t_4$, and $t_5$.

Table 14, shown beneath the timing diagram in FIG. 1, indicates which events are scheduled during the three consecutive clock cycles shown. During CLK0, events A and B occur at $t_1$, event D occurs at $t_2$, etc. At $t_4$ of CLK0, no events occur as indicated by the dash in the events column. Other events occur during CLK1 and CLK2, as indicated by table 14. An examination of table 14 indicates that the events possible at time $t_1$, are events A, B, and C. Similarly, the event D is possible at time $t_2$; events E and F are possible at time $t_3$; events G and H are possible at time $t_4$; and event I is possible at time $t_5$. For the exemplary integrated circuit associated with FIG. 1, these events are a complete set of all the possible events.

Figure 2:
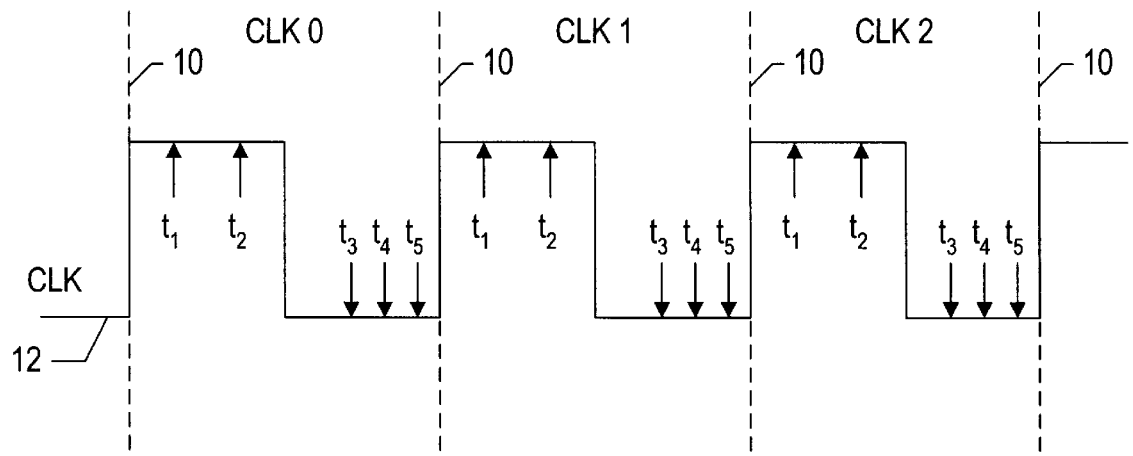
FIG. 2 is a timing diagram showing events generated according to a scheduled simulator.

Turning to FIG. 2, a timing diagram similar to that of FIG. 1 is shown. The timing diagram of FIG. 2 is associated with the same exemplary integrated circuit as the timing diagram of FIG. 1. Clock signal 12 is shown, along with times $t_1$, $t_2$, $t_3$, $t_4$, and $t_5$. Table 16 shows a scheduling of events according to the present invention. As table 16 shows, each of the possible events associated with the integrated circuit is processed during each clock cycle. For example, at time $t_1$, of each clock cycle events A, B, and C are processed. Referring to table 14 of FIG. 1, it is noted that event C does not occur during time t1 of CLK0. When event C is processed according to FIG. 2, the result of executing the event is the same as if event C were not processed. In particular, the processing of event C during CLK0 does not change the state of the exemplary integrated circuit, and other events are unaffected by the processing of event C during CLK0.

The events shown in table 16 are statically scheduled, as opposed to the dynamic scheduling shown in table 14. Static scheduling refers to scheduling which is performed prior to the beginning of simulation execution. Each possible event is scheduled, without knowledge of whether or not execution of the event is required within a given clock cycle.

The dynamic scheduling shown in table 14 of FIG. 1 is indicative of the scheduling performed by event driven simulators. As shown in table 14, the simulation of CLK0 would be as follows: The simulator advances to time $t_1$. Events A and B are scheduled at $t_1$, and so are processed by loading the appropriate data structure from memory, executing the function stored therein, and scheduling any resulting events. The next scheduled event is event D at time t2. Therefore, the event-driven simulator advances to $t_2$ and processes event D. Similarly, event E is scheduled at time $t_3$.

No events are shown in table 14 as being scheduled at time $t_4$. Therefore, the event-driven simulator advances from $t_3$ to $t_5$ and processes event I. During CLK0, the event-driven simulator processes a total of five events at four times within the clock cycle. Clock cycles CLK1 and CLK2 are processed similar to CLK0, according to the events scheduled (as shown in table 14). During CLK1, a total of 5 events are processed at four times. During CLK2, a total of 8 events are processed at five times.

Static scheduling of CLK0, CLK1 and CLK2 operates according to table 16. Similar to the event-driven simulator, a simulator according to the present invention processes events A, B, D, E, and I. Additionally, events C, F, G, and H are processed. Since the additional events do not actually occur in CLK0, processing the additional events results in no effect upon the integrated circuit model. A total of 9 events are processed at five times during each clock cycle.

As noted above, dynamic scheduling incurs a significant overhead associated with loading each event into the simulator for processing when the simulator arrives at the appropriate time. When a particular event is scheduled, it is not known how many other events will be processed prior to the processing of the event. Events previously scheduled between the current event and the particular event may create yet new events which occur at times prior to the particular event. Each event is stored in a data structure, and the event is logged for processing at the appropriate time. The events are isolated from one another in separate data structures, and so the scheduling of new events can in no way interfere with the data associated with previously scheduled events.

If the time required to process an event is defined as a unit of time, then the time required to load an event for processing and store data associated with events being scheduled may be defined as a number of units of time. A suitable number may be 150 units on the average. The number of units will be lower if fewer events are scheduled, and higher if more events are scheduled. In addition, the number of units may vary dependent upon the storage structure of the computer on which the simulators are executing. The number of units also varies based on the integrated circuit design being simulated. However, the number given is suitable for illustration herein.

The time required by the event driven simulator to simulate the clock cycles shown in FIG. 1 is arrived at by multiplying the number of events processed by 151 (150 time units to perform the loading and storing of events, plus one time unit to perform the event processing). As shown in table 14, the event-driven simulator processes 5 events during CLK0, 5 events during CLK1, and 8 events during CLK2. Therefore, the total number of time units for the event driven simulation of CLK0–CLK2 is:

(5 events in CLK0+5 events in CLK1+8 events in CLK2) *

151 time units/event=2718 time units.

In contrast, the static scheduling shown in table 16 of FIG. 2 processes a total of 27 events during CLK0–CLK2 (i.e. 9 events during each clock cycle). Therefore, 27 time units are required to process events shown in table 16. Because events are statically scheduled, a single, global data structure may be created containing variables and functions for all possible events. Therefore, no overhead of retrieving and storing events is incurred. As can be seen, the number of time units required to simulate a given integrated circuit design may be significantly reduced using static scheduling according to the present invention. In the example shown, execution time is 100 times faster using the present static scheduling method as opposed to the dynamic scheduling method of the event-based simulators.

It is noted that, in contrast to dynamic scheduling in which the increments of time between event processing steps vary from clock cycle to clock cycle, static scheduling produces a set of fixed time steps between event processing. In FIG. 2, events are processed at times $t_1$, $t_2$, $t_3$, $t_4$, and $t_5$ during each clock cycle. The clock cycle may be broken up into fixed time intervals at which events are processed. These fixed time intervals are referred to herein as "time slices". Identification of these time slices is described in more detail below.

Figure 3:
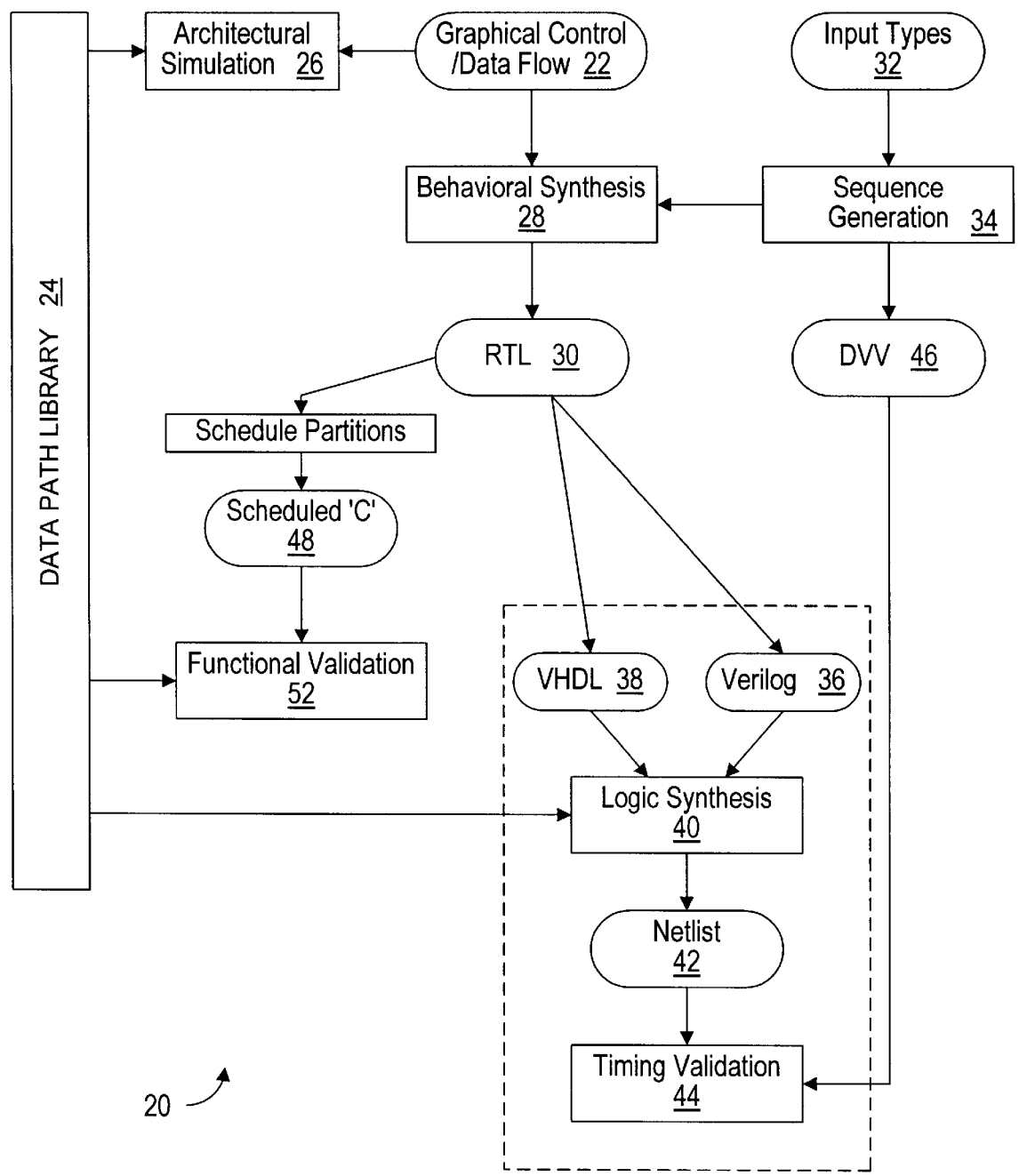
FIG. 3 is a flowchart of an integrated circuit design methodology according to the present invention.

Turning now to FIG. 3, an integrated circuit design process 20 according to the present invention is shown. Once the specifications of an integrated circuit have been defined, the integrated circuit is designed. The specification of an integrated circuit is a set of parameters which define the desired operation of the integrated circuit. These parameters may be determined by the designer or by those who have requested that the integrated circuit be designed, and are determined to be optimal parameters for the intended usage of the integrated circuit. The designer begins process 20 at step 22, in which a high level, behavioral description of a possible design is entered. A behavioral description includes little or no structural elements. Conversely, a functional description may include significant structural content. In a behavioral description, only the behavior of the integrated circuit in response to a stimulus is modeled. The elements available to the designer are stored in a data path library, indicated by box 24 in FIG. 3. The elements are assigned a particular functionality by the designer, such that when the elements are coupled together they form a model of the intended behavior of the integrated circuit.

Upon completion of the high level design entry, architectural simulation (step 26) is performed to determine if the high level design meets the specifications of the integrated circuit. Architectural simulation involves a relatively small number of test vectors. These test vectors are directed to exercise the high level functionality of the integrated circuit, as opposed to the more detailed verification to be performed upon the functional description of the design. Instead, the architectural simulation determines if the design approximates the specifications. For example, an integrated circuit embodying a microprocessor may be required to execute a certain sequence of instructions within a certain number of clock cycles. Architectural simulation may be used to determine whether or not the specification is met by the design.

Once the high level design is complete, a behavioral synthesis step 28 is performed to create a functional description from the graphical, behavioral description created in step 22. In one embodiment, the functional description is an RTL description. The functional description created by the behavioral synthesis step is represented by reference number 30 in FIG. 3. The behavioral synthesis step receives not only the behavioral description of the integrated circuit design, but also receives a set of input sequences and expected responses to those input sequences. The input sequences and responses are used by behavioral synthesis to develop combinatorial logic to control the elements created by the behavioral synthesis step. Input sequences are generated at steps 32 and 34 of FIG. 3. Elements and combinatorial logic are arranged into RTL format and stored as the RTL description.

RTL description 30 is stored in a format which may be utilized in several ways. Verilog code (represented by reference number 36) may be created from the RTL description. Conversely, VHDL code (represented as reference number 38) may be created from the RTL description. Conversion from RTL description 30 to Verilog code 36 or VHDL code 38 is a relatively minor step, and so is not shown in process 20. Software tools are commercially available for performing logic synthesis upon RTL descriptions written in Verilog and VHDL formats (step 40). An exemplary synthesis tool may be obtained from Cadence Design Systems, Inc. of San Jose, Calif. Logic synthesis uses the logic gates available in a particular semiconductor fabrication technology to realize the combinatorial logic of the RTL description. A netlist (shown as reference number 42) is created by logic synthesis step 40. Netlist 42 contains information indicative of the logic gates and elements included within the integrated circuit design. Connections between the elements and gates are defined, and often layout information indicative of the position of each element or gate is included. It is noted that the VHDL or Verilog descriptions 36 and 38 may be simulated using event-driven simulation as described above.

Circuit timing information may be extracted from netlist 42. Timing validation (step 44) may be performed upon the resulting netlist, to verify that the final design meets the timing specifications for the integrated circuit. Timing specifications may include the time required to propagate a signal upon an output pin of the integrated circuit, as well as a maximum period for the clock signal within the integrated circuit. Design validation vectors 46 are created to aid in timing validation step 44. The design validation vectors are created from sequence generation step 34. Design validation vectors are similar to test vectors, except that timing information is included in the design validation vector file.

Further details regarding behavioral synthesis of the behavioral description into an RTL description and subsequently to netlists may be found in the commonly assigned, co-pending patent application entitled: "Method for Graphically Representing a Digital Device as a Behavioral Description with Data and Control Flow Elements, and for Converting the Behavioral Description to a Structural Description", Ser. No. 08/212,908, filed Mar. 14, 1994, the disclosure of which is incorporated herein by reference in its entirety.

While RTL description 30 may be used to create Verilog and VHDL code for generating final netlists for the design, RTL description 30 may also be used to create scheduled source code 48 for compilation into a custom simulation engine. Scheduled source code 48 is source code, implemented in a suitable high level programming language, which implements functions representing each possible event within RTL description 30. Additionally, scheduled source code 48 includes a main routine configured to call each event during the appropriate time slice. Analyzing the RTL to determine the possible events and the necessary time slices is performed during scheduling step 50. Scheduling step 50 is described in more detail with respect to FIGS. 4 through 8. The scheduled source code is compiled into an executable program module, which may then be executed against test vectors to verify that the design is functionally correct (represented as step 52). In one embodiment, the scheduled source code created by scheduling step 50 is source code formulated in the C programming language. As used herein, source code is a text-based description of a program to be performed by a computer. The description is written according to the specifications of a particular programming language. It is noted that the creation of scheduled C source code is possible because the RTL description is synchronous, and therefore repetitive in time. A finite number of events occur repetitively according to various clocks within the RTL description. Therefore, a finite number of events may be defined which repeat in time and fully describe the operation of the integrated circuit.

The custom simulation engine created in accordance with the present invention is not a simulator which reads a model description, such as event-based simulators. Instead, the simulation engine is a compiled program representing the design. The program is capable of high speed simulation. If the integrated circuit being simulated is a microprocessor, for example, programs designed to run upon the microprocessor may be executed by the simulation engine. Other test vectors may be simulated as well. Additionally, the simulation engine is created automatically from the same RTL description as VHDL code 38 or Verilog code 36. The simulator and VHDL code 38 or Verilog code 36 are functionally equivalent by construction, and so no consistency checking need be performed between the different representations. If a custom simulator is developed manually, then such consistency checking must be performed to ensure that the simulator and the design are functionally equivalent. Often, consistency checking is complex to create and inadequate to verify the consistency of the representations. Inadequacy of the consistency checking often originates from the complexity of the integrated circuit rendering an adequate set of consistency checks virtually impossible to create.

Figure 4:
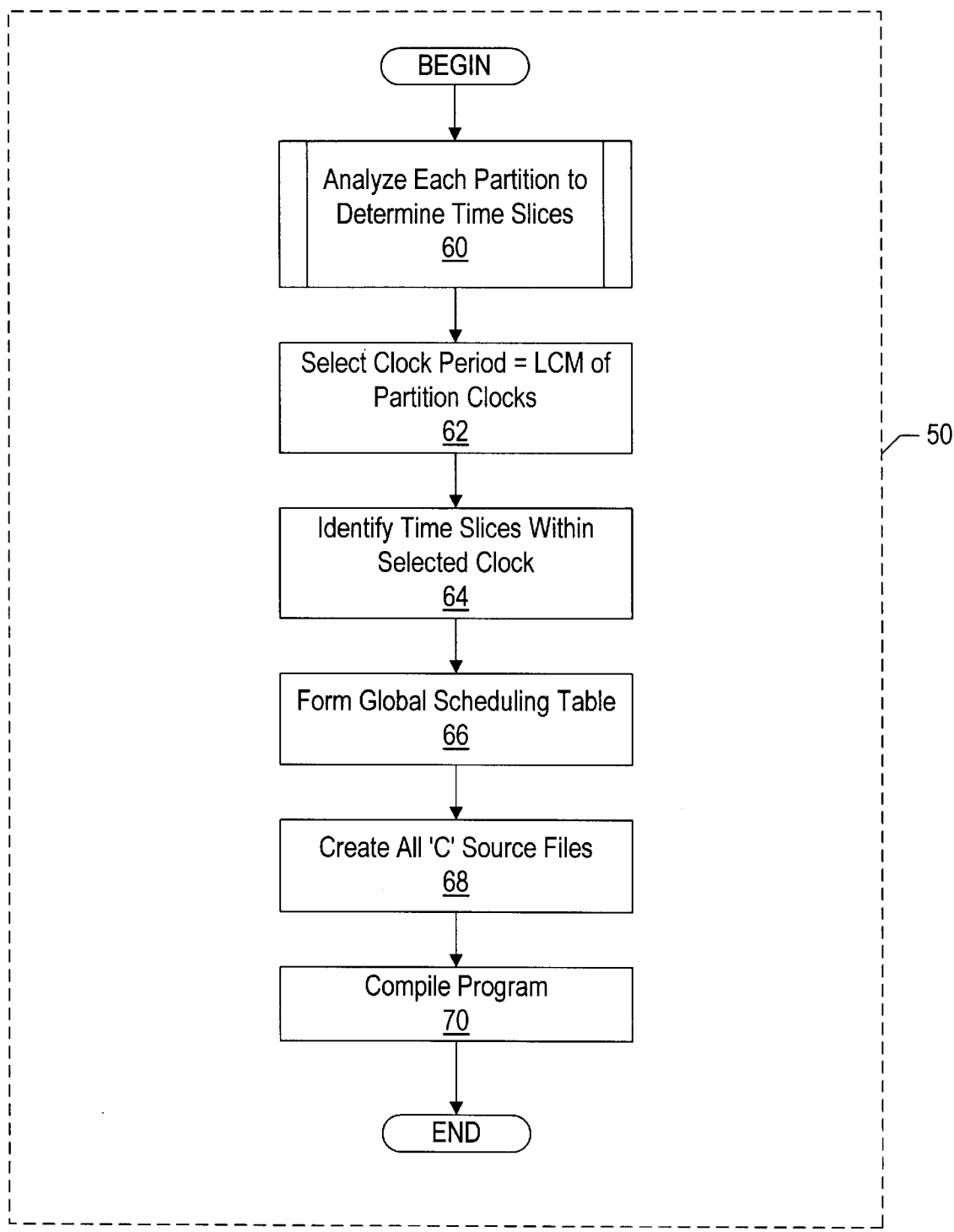
FIG. 4 is a flowchart depicting steps included in creating of a sliced synchronous simulation engine from an RTL description of an integrated circuit.

Turning now to FIG. 4, scheduling step 50 is shown in greater detail. Scheduling step 50 employs a plurality of steps, including a compilation step 70 which is performed after creation of scheduled source code 48 (shown in FIG. 3). The compilation step is included in scheduling step 50 for clarity.

Scheduling step 50 begins with step 60, in which each partition of RTL description 30 is analyzed to determine all possible events within the partition. Each event includes a time interval (or "time stamp") at which the event occurs. The time interval is measured with respect to the rising or falling edge of the clock defined for the partition (whichever edge is used for capturing state in the memory elements of the partition). Events which occur concurrently are grouped together to form a time slice, and a list of the time slices and events which occur in each time slice are created. It is noted that the RTL description includes information which identifies the function performed by each element. The information is used to create the source code functions for each element at each time slice. The clock associated with a particular partition will be referred to herein as a "partition clock". Similarly, time slices identified for a partition are referred to as "partition time slices".

After analyzing each partition within RTL description 30, the partition clocks are examined to select a "master clock" for the simulator. The master clock is the clock from which the time slices of the custom simulator will be measured. In one embodiment, the master clock is selected as a clock having a period equal to the least common multiple (LCM) of the partition clock periods within the RTL description (step 62). The least common multiple of the partition clock periods is the lowest period value into which each of the partition clock periods is evenly divisible. For example, three partition clocks having periods of 1, 3, and 5 nanoseconds would generate a master clock having a 15 nanosecond time period. Fifteen is the lowest clock period value evenly divisible by one, three, and five.

Having selected the master clock, the time slices within the master clock are identified (step 64). These time slices will be referred to herein as "master time slices". Several factors are considered in master time slice identification. First, time slices measured from a partition clock other than the master clock are adjusted such that they are referenced from the master clock. It is noted that the partition clocks are defined with respect to a common origin of time, so the phase relationships of the partition clocks may be determined. The master time slices are created by adjusting partition time slices by the calculated phase difference between the master clock and the associated partition clock.

Second, partition time slices associated with a partition clock having a shorter period than the master clock are repeated within the master clock, creating new master time slices. An exemplary partition may include a partition clock operating at half the period of the master clock. The time slices identified within the exemplary partition occur twice within the period of the master clock. Therefore, two identical sets of the partitions time slices would be included within the master time slices. The second set of time slices are positioned one partition clock period subsequent to the first set of time slices within the master clock period.

Third, time slices from different partitions may occur at the same time within the master clock. These time slices are combined to form a master time slice having events originating within multiple partitions.

The master time slices and which partitions include events within each master time slice are recorded in a global scheduling table (step 66). The global scheduling table identifies the function calls which are performed by the main routine within the scheduled source code model. Functions within each partition's scheduled source code are called by the main routine to perform events occurring during that master time slice.

After creating the global scheduling table, the scheduled source code files may be created (step 68). In one embodiment, four source code files are created for each partition. One source code file includes functions for each event identified for that partition. The functions are created from information in the RTL description identifying the actions related to a particular event. A second source code file contains functions which call each event function based on the master time slice the simulator is executing. A third source code file includes a main routine that may be used to compile and simulate each partition individually, without other partitions being included. Finally, a fourth source code file is created which includes function and constant definitions. The fourth source code file is often referred to as a "header file", since the information stored therein is often included by the compiler at the top of each of the other three source code files.

In addition to the source code files created for each partition, another set of three source code files are created in one embodiment. One of the source code files is a header file similar to the header file described above. A second source code file contains the main routine of the simulation engine, which calls each master time slice function in the correct order. The main routine is a loop which repetitively calls the master time slice functions, thereby simulating multiple clock cycles. The third source code file is a file of functions created by the behavioral synthesis tool. Included in the third source code file are multiplexor devices which are generated by behavioral synthesis if an element within the design is shared by several other elements. Finally, once the scheduled source code files are created, the source code is compiled by the appropriate high level language compiler. The result of the compilation step 70 is the executable simulation engine.

Because the custom simulator developed herein is used with synchronous integrated circuit designs and employs time slices for performing its processing, the simulator may be referred to as a "sliced synchronous simulation engine".

Figure 5:
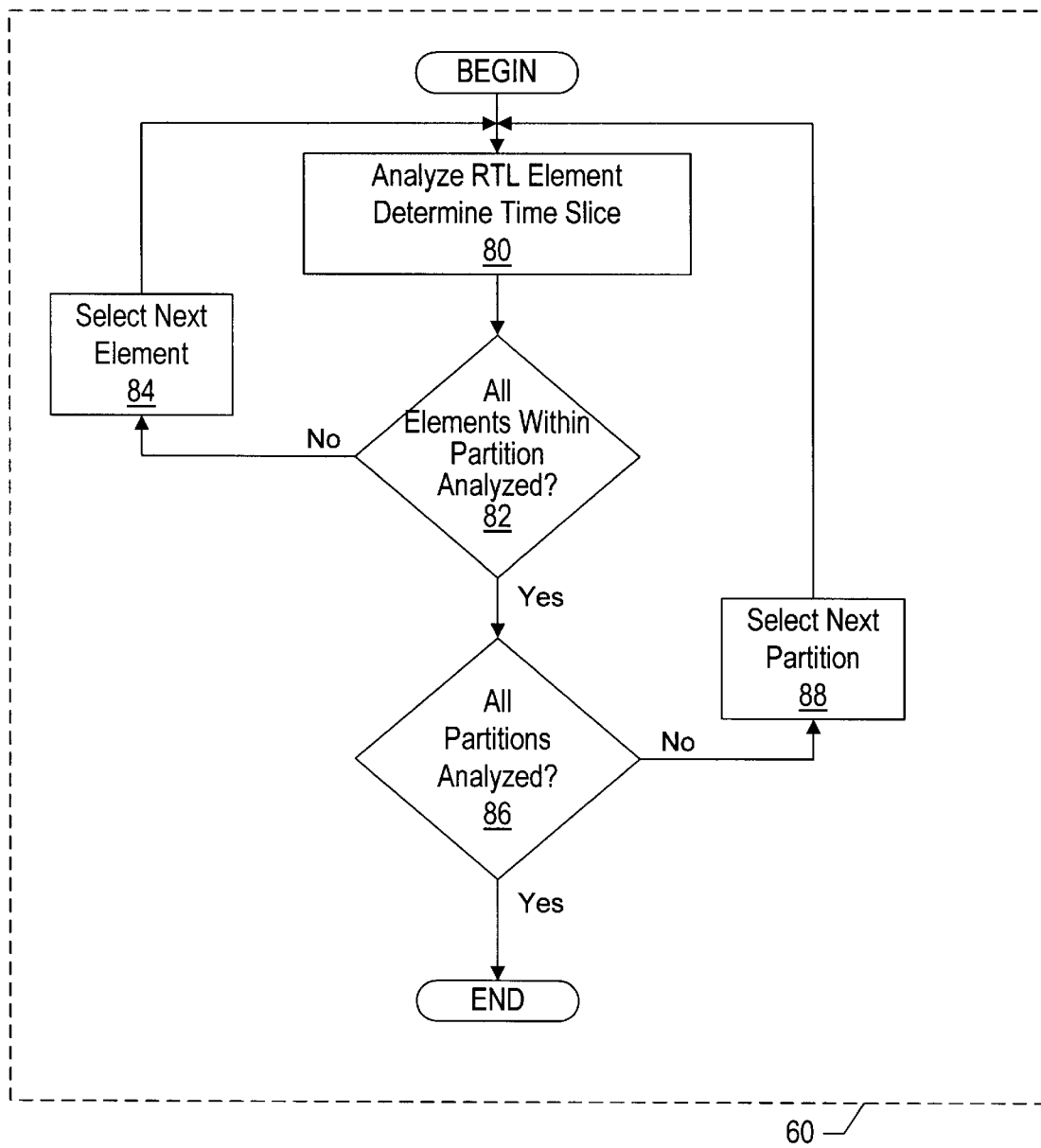
FIG. 5 is a flowchart of one of the steps shown in FIG. 4, further illuminating aspects of the step.

Turning now to FIG. 5, partition analysis step 60 (as shown in FIG. 4) is shown in more detail. Each RTL element is examined to determine at which time or times it creates an event (step 80). If the element creates an event at a time slice already defined for the current partition, then the event is added to that time slice. If the element creates an event at a time slice not yet defined, then a new time slice is created.

When analysis of the element is complete, the analyzer determines if the analyzed element is the final element in the partition (step 82). If the additional elements remain within the partition, the next element is selected (step 84), and step 80 is repeated for the next element.

If the elements of the current partition have been processed, then step 86 is executed. Step 86 determines if all the partitions within RTL description 30 have been processed. If additional partitions remain, then a new partition is selected (step 88) and the elements within the new partition are analyzed via steps 80 through 84. When analysis of a new partition begins, time slice information associated with the current partition is saved. New time slices are identified for the new partition. Because the partition clocks may have dissimilar phases and periods, time slices are determine for each partition and then combined into master time slices as described above. If all partitions have been analyzed, then step 60 is complete.

Turning now to FIG. 6, a global scheduling table 90 created by scheduling step 50 is shown. Each row of global scheduling table 90 is associated with a particular master time slice. Each column of global scheduling table 90 is associated with a particular partition within RTL description 30. For example, consider a particular partition "A" and a particular master time slice "B". If partition A includes at least one event in master time slice B, then a value indicating that partition A should be called during master time slice B is stored in row B and column A of global scheduling table 90. In one embodiment, the value stored is a binary one. Conversely, if partition A includes no events in master time slice B, then a second value indicating that partition A should not be called during master time slice B is stored in row B and column A of global scheduling table 90. In one embodiment, the second value stored is a binary zero. The global scheduling table may be used at step 68 (shown in FIG. 4) to create the appropriate function calls in the main routine of the custom simulator.

As the embodiment of global scheduling table 90 shown in FIG. 6 indicates, multiple partitions may be called within a particular time slice. For example, master time slice 2 calls partition 2 and partition N-2. Additionally, partitions may be called from more than one master time slice. For example, partition zero is called in time slice 1 and time slice M. FIG. 6 shows a global scheduling table for a design having M time slices and N partitions. M and N need not be equal for a given design. A given design may include more time slices than partitions, or less time slices than partitions.

Figure 7:
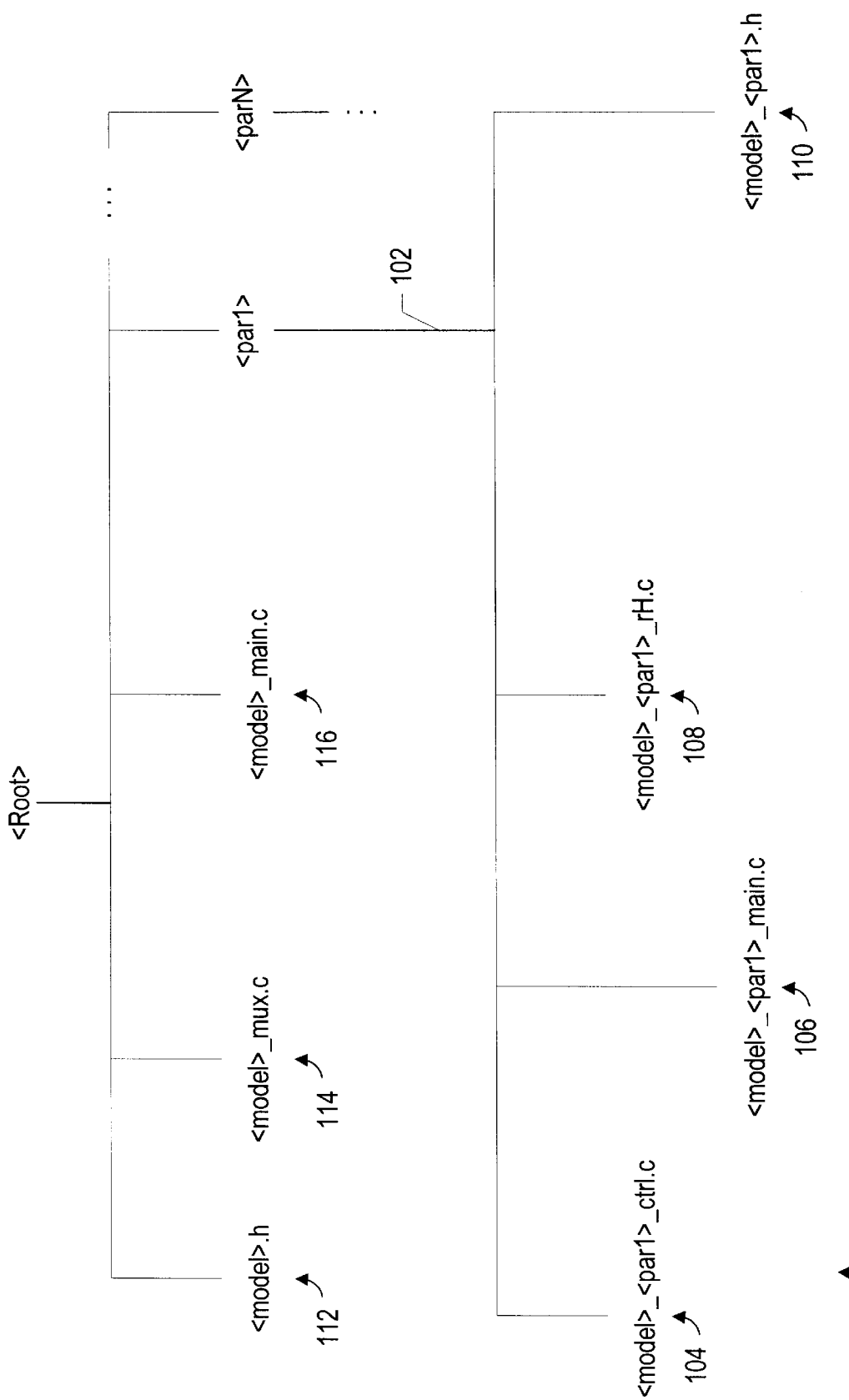
FIG. 7 is a diagram showing a directory structure of source code files created during one of the steps shown in FIG. 4.

Turning now to FIG. 7, an exemplary directory structure of scheduled source code files is shown. FIG. 7 includes a root directory including the second set of source files described with respect to FIG. 4, and one or more partition directories. Each partition directory includes the first set of source code files described with respect to FIG. 4. Files or directories having names enclosed within greater than and less than signs are names which are generated according to the names used in the design. For example, if the design is a microprocessor, the <model> field of the names might be replaced by "microprocessor". The <Root> directory is named by the user.

Each partition is accorded a subdirectory such as subdirectory 102 associated with the first partition of the design. Stored in subdirectory 102 are four source code files 104, 106, 108, and 110. File 104 includes the functions defined by the RTL description for the first partition. In one embodiment, functions include one or more of the following: next state computation, gated clock expressions, output valid expressions, multi-function select expressions, multiplexor select expressions, and tri-state buffer select expressions. Next state computation computes the state of the partition to be captured upon the next clock edge. Gated clock expressions are expressions which may modify the clock for the partition, cancelling a rising or falling edge of the clock. Output valid expressions determine when the output of an element is valid. Some elements may be defined to execute multiple functions. Multi-function select expressions determine which of the multiple functions such an element executes during a given time slice. Multiplexor select expressions select the output of a multiplexor from a plurality of inputs. Tri-state buffer select expressions determine if a tri-state buffer is to drive its output to a logical one, a logical zero, or a tri-state value.

File 106 is a main loop program which allows the partition to be simulated independent of the other partitions of the model. It includes functions calls for each of the time slices of the partition. File 108 includes functions for each time slice, called by file 106 and by the main simulation routine in the <Root> directory. The source code within file 108 performs a "local scheduling" operation in which the code determines which time slice is being requested upon a particular call to file 108. The appropriate functions are called based upon the local scheduling operation.

For added flexibility, local scheduling determines whether or not the current elapsed time (measured from the beginning of the simulation) is enough to complete the partition's reset sequence. A reset sequence is a sequence of clock cycles in which the partition is reset to a known state prior to beginning operation. If the reset sequence is not complete, then local scheduling does not call any of the functions for the respective time slice. During a time slice in which memory elements capture values, the capture is performed prior to calling any functions.

Source code file 108 further includes input/output declarations defining the interconnect of the partition to other partitions within the model. Additionally, variables and storage declarations for memory elements are declared. The input/output variables and memory element storage are declared as global variables, as opposed to local variables in event-drive simulators. It is noted that global variables are stored in an area of memory which is accessible to all functions within the program. Conversely, local variables are stored in an area of memory isolated to a particular function or source code file. Because the global variables are available to all code, no expensive variable-passing is needed between functions.

File 110 includes constant declarations, a definition of the clock for the partition, and definitions of the time slices associated with the partition. These time slices are partition time slices measured with respect to the partition clock.

Returning to the <Root> directory, in addition to at least one subdirectory similar to subdirectory 102, three source code files are stored. The three files are denoted by reference numbers 112, 114, and 116 in FIG. 7. File 112 is a constant definition file, similar to file 110. File 112 defines the master clock and the master time slices. File 114 includes multiplexor select expressions for multiplexors inserted by the behavioral synthesis step described above. File 116 is similar to file 106, except that function calls associated with each master time slice may call functions from many different partitions.

Figure 8:
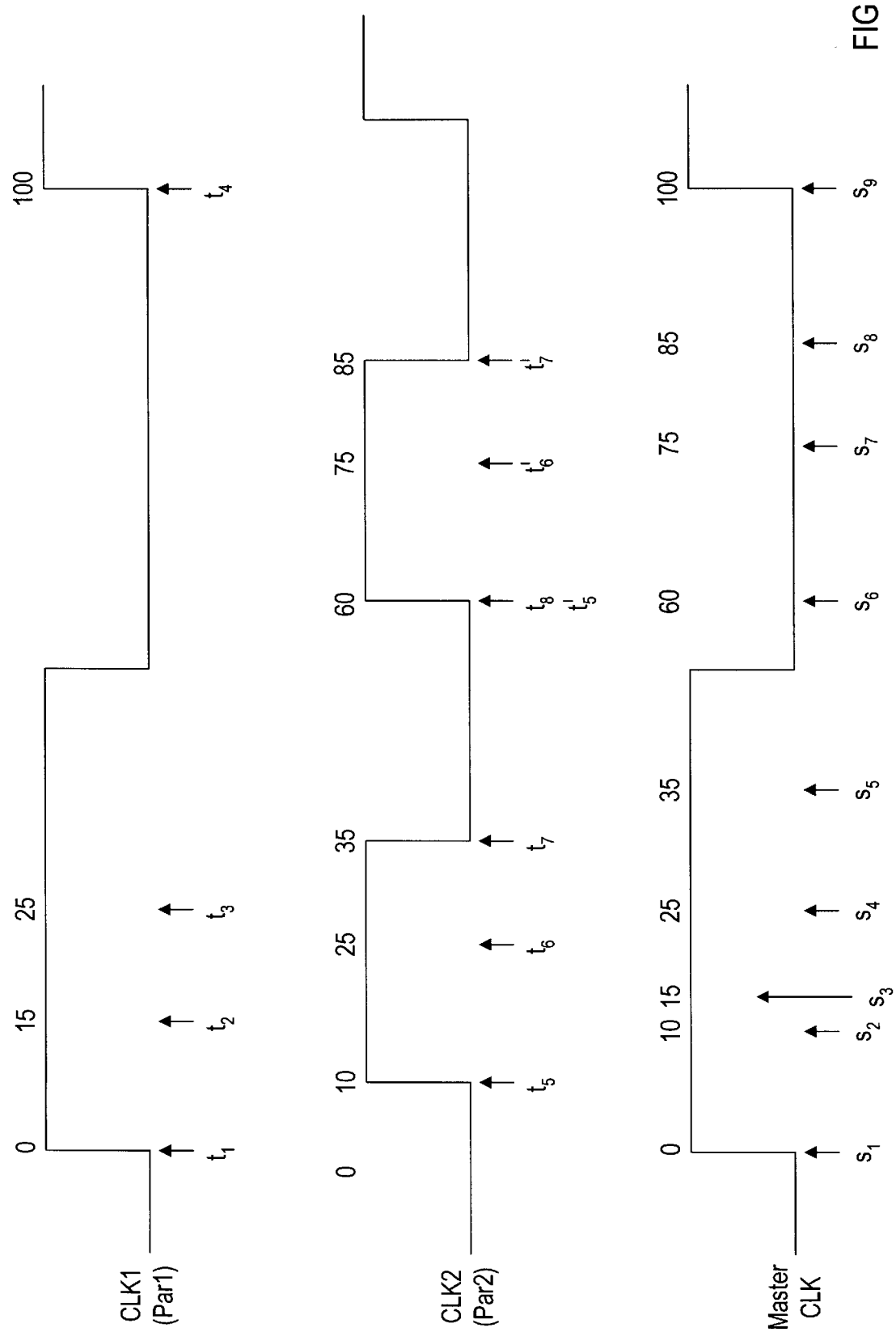
FIG. 8 is a timing diagram of two clocks from an exemplary integrated circuit design showing the recalibration of events into the master clock of the design.

Turning now to FIG. 8, an exemplary pair of clocks from a design are shown as CLK1 (associated with partition one) and CLK2 (associated with partition two). The master clock is shown below CLK1 and CLK2 and is chosen to be equivalent to CLK1. CLK1 is chosen as the master clock since it has the longer period of CLK1 and CLK2 and the period of CLK2 evenly divides into the period of CLK1. Partition one includes time slices at $t_1$, $t_2$, $t_3$, and $t_4$. Similarly, partition two includes time slices at $t_5$, $t_6$, $t_7$, and $t_8$. Each time slice occurs at a particular time, measured in nanoseconds. The time for each time slice is listed above that time slice. The time of zero nanoseconds is set at the rising edge of CLK1. For example, $t_2$ occurs at 15 nanoseconds. CLK2 is 10 nanoseconds out of phase with respect to CLK1, and is one half the period of CLK1. The period of CLK1 is 100 nanoseconds, while the period of CLK2 is 50 nanoseconds.

Having chosen the master clock as CLK1, the next step in producing the sliced synchronous simulation engine is to duplicate the time slices associated with CLK2 which occur for a second time during one period of CLK1. As shown in FIG. 8, time slices $t_5$, $t_6$, and $t_7$ occur for a second time before the first period of CLK1 ends. The duplicated time slices are shown as $t_5'$, $t_6'$, and $t_7'$. From the set of time slices shown, a set of master time slices may be created. The master time slices are shown as $S_1$ through $S_9$ beneath the master clock. Each of the master time slices are shown in Table 1 below, along with which time slices from the two partitions comprise the master time slice.

TABLE 1

Master Time Slices and the Partition Time Slices Comprising Each Master Time Slice

| Master Time Slice | Partition Time Slices-Partition 1 | Partition Time Slices-Partition 2 |
| --- | --- | --- |
| $S_1$ | $t_1$ | — |
| $S_2$ | — | $t_5$ |
| $S_3$ | $t_2$ | — |
| $S_4$ | $t_3$ | $t_6$ |
| $S_5$ | — | $t_7$ |
| $S_6$ | — | $t_8, t_5'$ |
| $S_7$ | — | $t_6'$ |
| $S_8$ | — | $t_7'$ |
| $S_9$ | $t_4$ | — |

An examination of Table 1 reveals several different types of master time slices. First, a master time slice may corresponding to a partition time slice. $S_1$, $S_2$, $S_3$, $S_5$, and $S_9$ are the first type of master time slice. Second, a master time slice may include partition time slices from different partitions. $S_4$ is the second type of time slice. Third, a master time slice may include repeated time slices from a partition which is not a partition including the master clock. $S_6$, $S_7$, and $S_8$ are the third type of master time slice.

Figure 9:
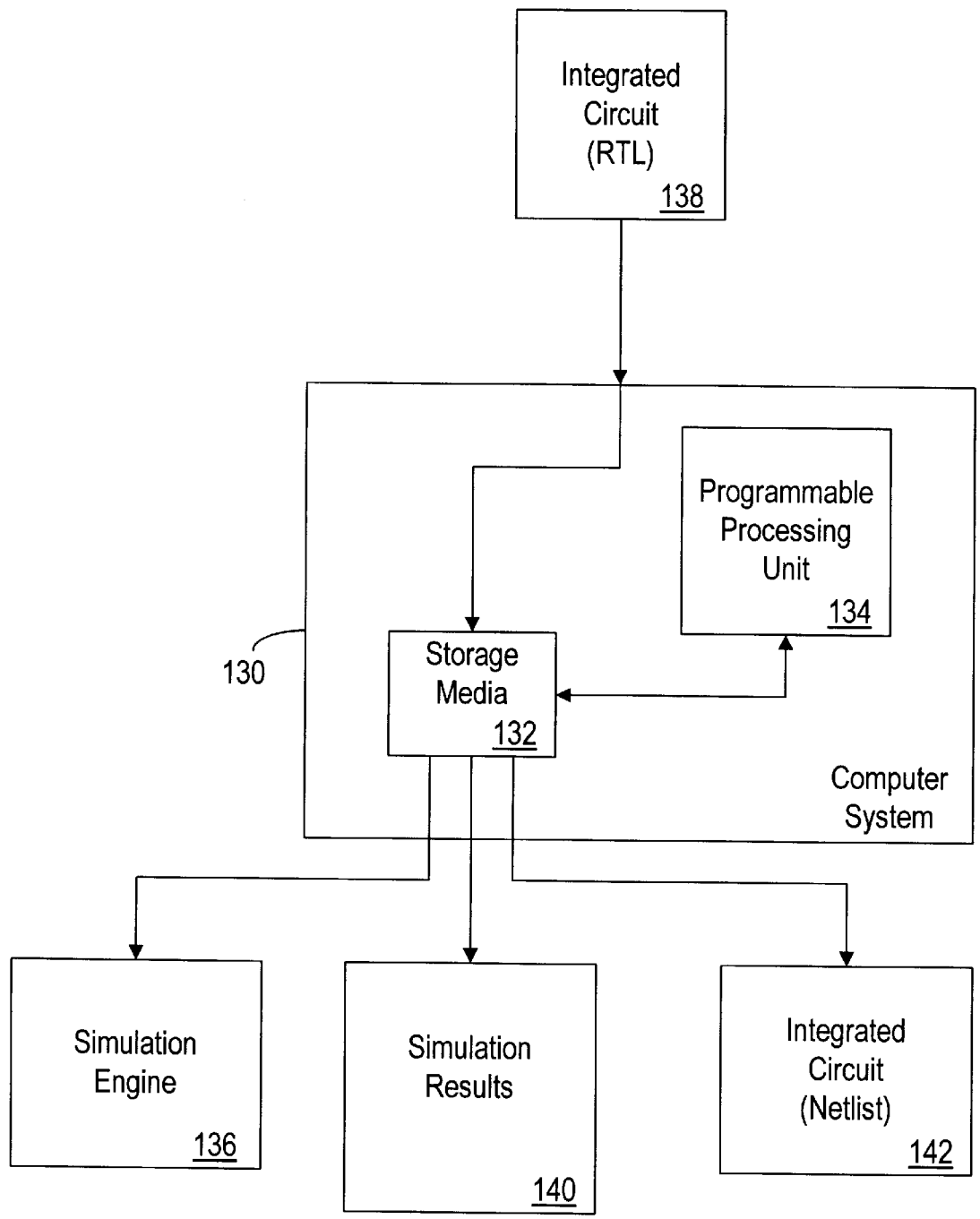
FIG. 9 is a block diagram of a computer system upon which the simulation engine representing the integrated circuit is created and executed.

Turning now to FIG. 9, a block diagram of one embodiment of a computer system 130 is shown. Computer system 130 receives a first integrated circuit 138, represented as an RTL description. Integrated circuit 138 is stored within a storage media 132. Storage media 132 is a device which stores digital data. Exemplary storage media may include a CD-ROM, a hard disk, a floppy disk, a semiconductor memory within computer system 130, or any other type of memory within computer system 130. Additionally stored within storage media 132 is object code implementing the integrated circuit design methodology described herein. Object code is digital data indicative of a plurality of instructions to be executed by a programmable processing unit 134.

Storage media 132 is coupled to programmable processing unit 134. Programmable processing unit 134 includes at least one processing device, such as a microprocessor, configured to execute instructions comprising object code stored within storage media 132. Programmable processing unit 134 is additionally configured to operate upon data stored within storage media 132. Exemplary data may include the RTL description of an integrated circuit 138. Programmable processing unit 134 stores manipulated data and data created via execution of object code within storage media 132. Exemplary manipulated data may include a simulation engine 136 representing a modeled integrated circuit 138. Additionally, manipulated data may include simulation results 140 created by simulation engine 136. The simulation results indicate operation of integrated circuit 138 according to a particular set of input stimuli. Manipulated data may further include a second integrated circuit 142. Second integrated circuit 142 may be represented as a netlist from which the integrated circuit may be fabricated.

Second integrated circuit 142 may differ from first integrated circuit 138. Changes to the integrated circuit design may be introduced by the designer upon analyzation of simulation results 140. Simulation results 140 may indicate that integrated circuit 138 does not meet the specifications for integrated circuit 138. Therefore, integrated circuit 138 is changed into integrated circuit 142 through a process of iteratively modifying the integrated circuit design and simulating the integrated circuit design upon computer system 130. Once integrated circuit 142 is completed and is proven to meet specifications for the integrated circuit, integrated circuit 142 may be fabricated from the netlist stored within storage media 132.

In accordance with the above disclosure, a method for automatically producing a sliced synchronous simulation engine or model from an RTL description has been shown. The present simulation engine advantageously simulates the modeled design at high speed. Numerous, complex test vectors may be applied to the model in a significantly shorter period of time than was achievable in prior art simulators. Additionally, since the model is derived directly from the RTL which describes the design, the model is correct by construction. There is no simulation of the Verilog or VHDL model required, and there is no consistency problem between the present model and the VHDL or Verilog model. Design time may be advantageously decreased by the speed at which functional verification may be performed. Furthermore, the design may be of much higher quality due to the more complex simulation enabled by the present simulator.

Numerous variations and modifications will become apparent to those skilled in the art once the above disclosure is fully appreciated. It is intended that the following claims be interpreted to embrace all such variations and modifications.

What is claimed is:

1. A method for creating a simulation engine from a functional description of an integrated circuit, comprising:
    statically scheduling events associated with said functional description, said statically scheduling comprising analyzing each one of a plurality of partitions within said functional description to determine each time at which an event occurs, wherein each time is measured with respect to a clock associated with said one of said plurality of partitions, and wherein at least one of a phase and a period of said clock associated with a first one of said plurality of partitions differs from a corresponding feature of said clock associated with a second one of said plurality of partitions;
    forming scheduled source code according to said step of statically scheduling; and compiling said source code into said simulation engine.

2. The method as recited in claim 1 wherein said statically scheduling comprises selecting a master clock for said simulation engine.

3. The method as recited in claim 2 wherein said master clock has a period equal to the least common multiple of the periods of a plurality of clocks associated within said functional description.

4. The method as recited in claim 1 wherein said statically scheduling comprises recalibrating said events with respect to a master clock, wherein said master clock is the clock for said simulation engine.

5. The method as recited in claim 1 wherein said scheduled source code is formulated in a programming language.

6. The method as recited in claim 5 wherein said programming language is the C programming language.

7. The method as recited in claim 1 further comprising executing said simulation engine to determine if said functional description of said integrated circuit substantially fulfills a specification of said integrated circuit.

8. The method as recited in claim 1 wherein said statically scheduling comprises forming a global scheduling table.

9. The method as recited in claim 8 wherein said global scheduling table defines which ones of a plurality of partitions within said functional description include events within each time slice identified during said statically scheduling.

10. The method as recited in claim 1 further comprising forming an event-driven simulation model, wherein said simulation engine and said event-driven simulation model are functionally equivalent.

11. The method as recited in claim 1 further comprising executing said simulation engine, wherein executing said simulation engine comprises, during each clock cycle as defined by a master clock selected during said statically scheduling, evaluating, at least once, each event identified during said statically scheduling.

12. A method for creating a custom simulation engine from a functional description of an integrated circuit, comprising:

statically scheduling events associated with said functional description;

deriving scheduled source code from said step of statically scheduling; and compiling said source code, thereby creating said custom simulation engine, wherein said custom simulation engine comprises an executable program module derived from said scheduled source code.

13. The method as recited in claim 12 wherein said statically scheduling comprises analyzing each one of a plurality of partitions within said functional description to determine each time at which an event occurs, wherein each time is measured with respect to a clock associated with said one of said plurality of partitions.

14. The method as recited in claim 13 wherein said statically scheduling comprises selecting a master clock for said simulation engine.

15. The method as recited in claim 14 wherein said master clock has a period equal to the least common multiple of the periods of a plurality of clocks associated within said functional description.

16. The method as recited in claim 14 wherein said master clock is divided into a plurality of time slices, and wherein each one of said plurality of time slices includes at least one event.

17. The method as recited in claim 16 wherein a particular event corresponding to a particular one of said plurality of partitions is included within a plurality of said plurality of time slices if said clock associated with said particular one of said plurality of partitions has a period shorter than a period of said master clock.

18. The method as recited in claim 16 wherein a particular one of said plurality of time slices includes a first event corresponding to a first one of said plurality of partitions and a second event corresponding to a second one of said plurality of partitions.

19. The method as recited in claim 2 wherein said statically scheduling comprises repeatedly scheduling a particular event detected within said one of said plurality of partitions if a first period of said clock associated with said one of said plurality of partitions is shorter than a second period of said master clock.

20. The method as recited in claim 19 wherein a number of times said particular event is scheduled is equal to a ratio of said second period to said first period.

21. The method as recited in claim 2 wherein said scheduled source code corresponding to each one of said plurality of partitions comprises:

(i) a first plurality of functions, wherein each of said first plurality of functions corresponds to one of said events within said one of said plurality of partitions;

(ii) a second plurality of functions, wherein each one of said second plurality of functions corresponds to a time slice within a period of said master clock in which at least one of said first plurality of functions is scheduled according to said statically scheduling;

(iii) a partition routine configured to call each one of said second plurality of functions according to an order of said time slices; and (iv) a set of constant and function definitions.

22. The method as recited in claim 21 wherein said scheduled source code further comprises a main routine configured to call each of said second plurality of functions corresponding to each of said plurality of partitions according to a time slice in which said each of said second plurality of functions corresponding to each of said plurality of partitions is scheduled.

23. The method as recited in claim 1 wherein said scheduled source code comprises a plurality of functions, one for each time slice in which at least one event occurs in at least one of said plurality of partitions, and a main routine which repetitively calls each of said plurality of functions in time slice order.

24. The method as recited in claim 1 wherein said phase of said clock associated with said first one of said plurality of partitions differs from said phase of said clock associated with said second one of said plurality of partitions while said period of said clock associated with said first one of said plurality of partitions is equal to said period of said clock associated with said second one of said plurality of partitions.

25. The method as recited in claim 1 wherein said period of said clock associated with said first one of said plurality of partitions differs from said phase of said clock associated with said second one of said plurality of partitions.

* * * * *